United States Patent [19]
Lichtenwalter et al.

[11] Patent Number: 5,266,036
[45] Date of Patent: Nov. 30, 1993

[54] REDUCTION OF RADIO FREQUENCY EMISSIONS THROUGH TERMINATING GEOMETRICALLY INDUCED TRANSMISSION LINES IN COMPUTER PRODUCTS

[75] Inventors: Guy E. Lichtenwalter, San Jose; Edward C. Miller, Los Gatos, both of Calif.

[73] Assignee: Hewlett-Packard Company, Palo Alto, Calif.

[21] Appl. No.: 892,444

[22] Filed: Jun. 2, 1992

[51] Int. Cl.$^5$ ............................................... H05K 1/11
[52] U.S. Cl. .................................. 439/65; 174/35 R; 174/35 GC; 174/35 TS
[58] Field of Search ........... 174/35 R, 35 GC, 35 TS, 174/51; 361/412, 413, 415, 424; 338/60-63, 64, 66; 439/65

[56] References Cited

U.S. PATENT DOCUMENTS

| | | | |
|---|---|---|---|
| Re. 29,018 | 10/1976 | Garuts | 338/216 |
| 3,740,676 | 6/1973 | Garuts | 338/216 |
| 4,210,885 | 7/1980 | Ho | 333/238 |
| 4,310,812 | 1/1982 | DeBloois | 338/217 |
| 4,510,468 | 4/1985 | Mayer | 338/214 |
| 4,703,288 | 10/1987 | Frye et al. | 333/1 |
| 5,059,892 | 10/1991 | Stoft | 324/73.1 |

Primary Examiner—Gary F. Paumen
Attorney, Agent, or Firm—Roland I. Griffin; Alan H. Haggard

[57] ABSTRACT

Radio frequency emissions within a computer system having a printed circuit assembly in proximity of a metal surface are reduced by the placement of one or more lossy components electrically connected to a metal plane within the printed circuit assembly. A connector electrically connects the lossy components to the metal surface. In one embodiment, the lossy components include two resistors at opposite ends of an edge of the printed circuit assembly that is closest to the metal surface. In an alternate embodiment, a single lossy component is a resistor placed in the middle of an edge of the printed circuit assembly that is closest to the metal surface. In the alternate embodiment, a second connector at a first end of the edge of the printed circuit assembly that is closest to the metal surface directly connects the metal plane to the metal surface, and a third connector at a second end of the edge of the printed circuit assembly that is closest to the metal surface directly connects the metal plane to the metal surface. A spring is used to connect the printed circuit assembly to the metal surface. Ends of the spring are inserted into vias within the printed circuit assembly. Traces on the printed circuit assembly electrically connect the vias to the lossy component. Similarly, the vias may be directly connected to a ground or power plane without an intervening lossy component.

16 Claims, 8 Drawing Sheets

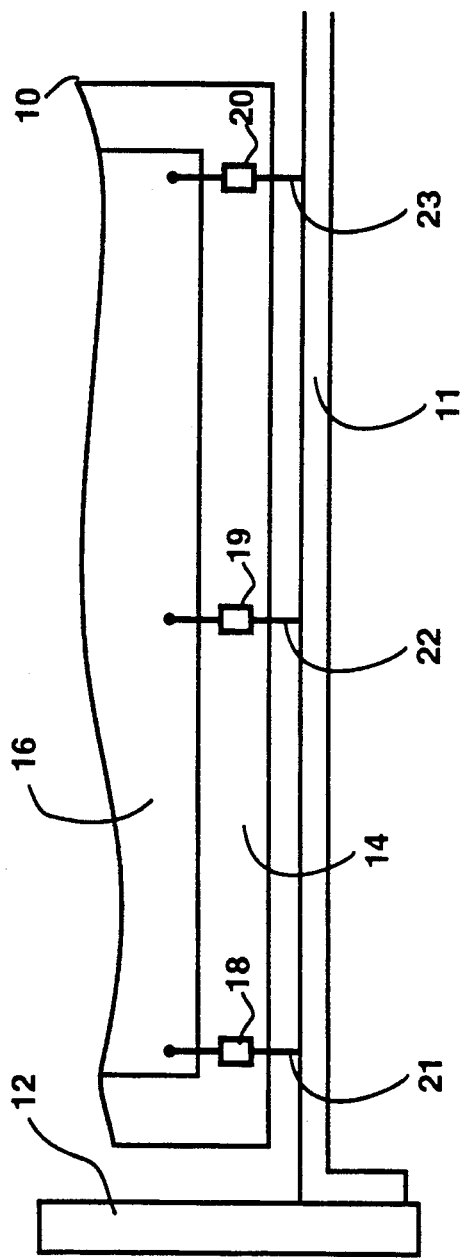
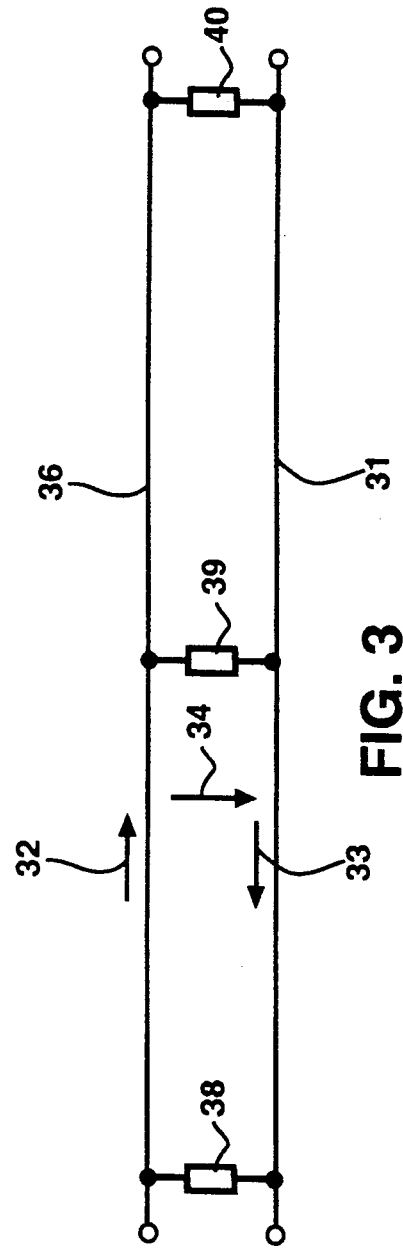

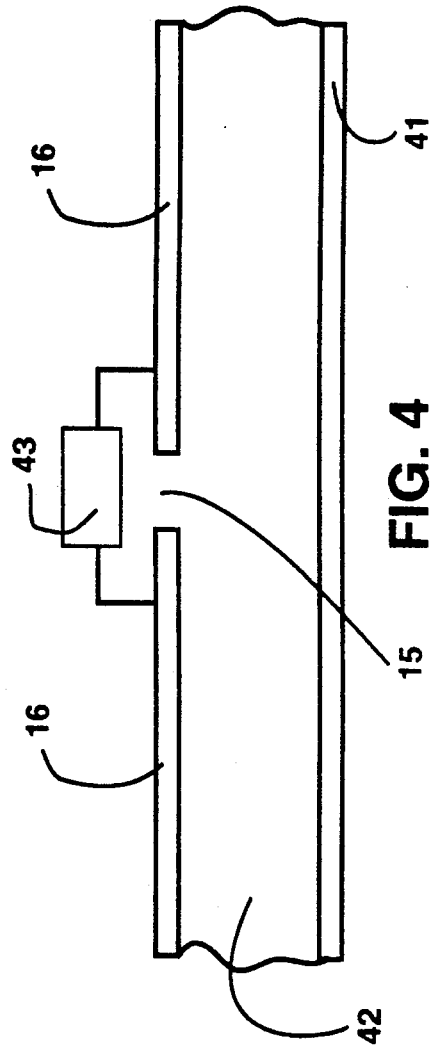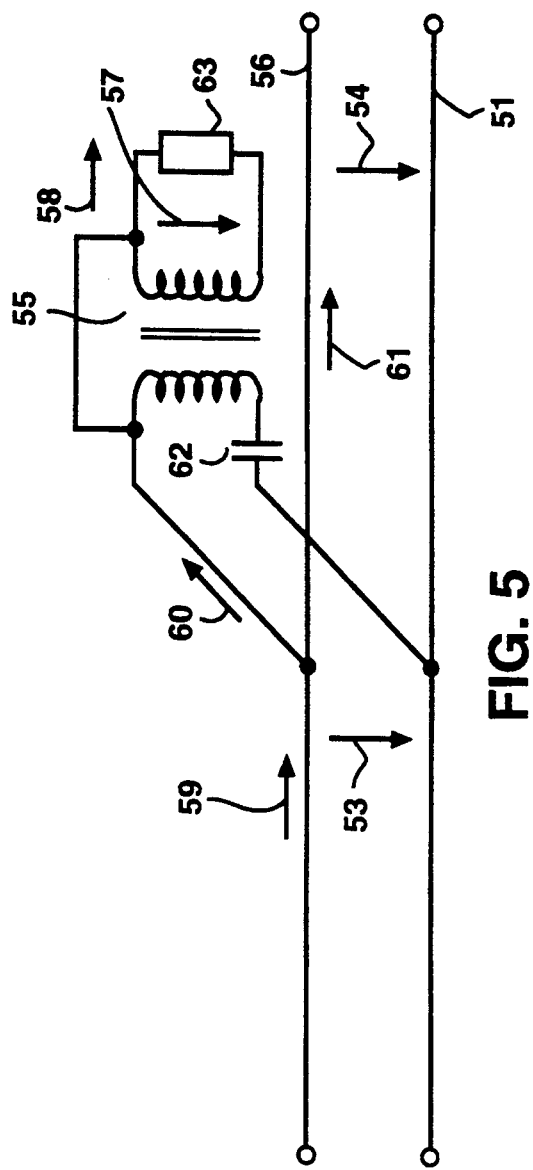

REDUCTION OF RADIO FREQUENCY EMISSIONS THROUGH TERMINATING GEOMETRICALLY INDUCED TRANSMISSION LINES IN COMPUTER PRODUCTS

BACKGROUND

The present invention concerns the addition of terminators to reduce radio frequency (RF) transmissions which appear when RF energy propagated on a printed circuit assembly (PCA), due to geometrically induced transmission line effects, propagates outside the PCA and becomes radiated waves. The present invention also concerns the design of connectors on the PCA which are used by the terminators.

When components on PCAs contain digital signals which switch state, excess energy, in the form of RF signals, is generated. The RF signals are generated from the residual spectral energy that is not necessary for the functionality of the digital circuits. Often these RF signals are available in adequate levels to be coupled into potentially radiating structures. This may result in RF frequency pollution being transmitted outside the system containing the PCA.

A slot or gap of any length between two metal surfaces can form a potential transmission line which can serve as a radiating structure which propagates and enhances RF signal matching to the environment. Consequently, it is desirable to somehow reduce the radiating effect of slots or gaps which exist in PCAs and their surrounding structures.

In the prior art, various design features are used to reduce radiated RF signals. For example, in order to filter out the transfer of electrical noise between two planer structures, the two planar structures may be isolated from each other. Signals traveling between the two planar structures are propagated through narrow traces, which are much narrower than the distance between the two planar structures. However, the resultant structures may have resonant properties at certain frequencies which can be within the range of the frequency spectrum of the harmonic frequencies of the functional digital logic used. Such a design, may result in acceptable isolation between the two planar structures until a change in clock frequency or digital logic edge speed will stimulate the structure to resonate with the result of unacceptable RF emissions.

Alternate to the use of small thin traces, a choke coil has been used for connections between two isolated planar structures. However, the Q of the resulting circuit can still be too high to preclude discreet resonances. Thus emissions at selective resonant frequencies may still occur. Additionally, this method requires the use of expensive choke coils, which increase the manufacturing cost of the total system.

Various resistance and capacitance filter schemes using discrete devices have also been employed to decouple RF energy from a product and its outside interfaces. These schemes also can increase the manufacturing cost of the total system.

In addition, in order to eliminate electromagnetic interference (EMI), metal planes have been used that fold back under a PCA and are connected to the PCA along a single edge. However, these metal planes also have a tendency to resonate and radiate RF signals, often at unexpected frequencies.

Also, a well shielded cabinet may be used in order to prevent the escape of RF radiation. While often successful, small changes in the methods of fastening the cabinet or the introduction of air vents may result in increased RF signal emissions. Additionally, well shielded cabinets can be costly, adding to the manufacturing costs of a system.

In a common prior art solution, PCAs are grounded to a sheet metal cardcage by using spring-finger card guides. These guides are usually riveted to the metal cardcage and usually run the entire depth of the PCA, thus providing numerous contact points along the edge of the PCA. Flexible, spring-fingers of the rigidly mounted cardguide make contact with a plated section or pad on the surface of the circuit board. If grounding is not desired along the entire edge of the board, then discrete sections of the guide can be riveted in place and discreet pads are required on the surface of the board. However, rivet-on grounding devices are an expensive and cumbersome way to achieve grounding. Further, riveted-on guides can be hard to repair if a spring-finger is damaged or broken, since rivets would need to be removed and then replaced. Some of these guides can catch or snag the leading corner or edge of a circuit board, unless the guide provides a good, snag-free lead-in feature. In some cases, the edge of the board can actually slide over the head of the rivet that is used to attach the guide. This has the potential for snagging the board, especially if the rivet has not been installed properly. Retrofitting a cardcage with rivet-on grounding devices may be difficult, since the thickness of the guide and the heads on the rivets may not fit in the allowable height. Additionally, spring-finger guides apply a lateral force to the circuit board. This can sometimes cause misregistration between the mating connectors of the backplane and the slide-in circuit board. Insertion forces are always higher when using a spring-finger guide. This increased insertion force is a disadvantage.

SUMMARY OF THE INVENTION

In accordance with the preferred embodiment of the present invention, a device is presented for reducing radio frequency emissions within a computer system having a printed circuit assembly in proximity of a metal surface. The device includes one or more lossy components electrically connected to a metal plane within the printed circuit assembly. A connector electrically connects the lossy components to the metal surface.

In one embodiment of the present invention, the lossy components include two resistors at opposite ends of an edge of the printed circuit assembly that is closest to the metal surface. In an alternate embodiment of the present invention, a single lossy component is a resistor placed in the middle of an edge of the printed circuit assembly that is closest to the metal surface. In the alternate embodiment a second connector at a first end of the edge of the printed circuit assembly that is closest to the metal surface directly connects the metal plane to the metal surface, and a third connector at a second end of the edge of the printed circuit assembly that is closest to the metal surface directly connects the metal plane to the metal surface.

In an alternate, more general embodiment of the present invention, radio frequency emissions within a computer system having two metal surfaces within close proximity are reduced by electrically connecting a lossy component between the metal surfaces. Also, radio frequency emissions from a printed circuit assembly having two parallel metal planes acting as a transmission line system are reduced by creating a slot in one of the metal planes and connecting a lossy component across the slot in the metal plane.

In the preferred embodiment of the present invention, the connector used to connect the printed circuit assembly to the metal surface is a spring. Ends of the spring are inserted into vias within the printed circuit assembly. Traces on the printed circuit assembly electrically connect the vias to the lossy component. Similarly, the vias may be directly connected to a ground or power plane without an intervening lossy component.

For example, the spring has a first end and a second end. The first end is inserted in a first via within the printed circuit board. The first end enters the first via on a first side of the printed circuit assembly. The second end is inserted in a second via within the printed circuit board. The second end enters the second via on a second side of the printed circuit assembly. When the spring is deflected by the metal surface, the spring establishes electrical contact with the metal surface and a portion of the spring retreats into a notch in the printed circuit assembly. In the preferred embodiment the spring includes a coil which retreats into the cavity within the printed circuit assembly.

The present invention has several advantages over the prior art. The use of lossy components to terminate geometrically induced transmission lines is effective and cost efficient. Further, use of the spring connector described herein allows an implementation of a grounding device that is easier to install and remove than traditionally electrical connection devices. The vias used to attach the connector springs to the printed circuit assembly can be added with little or no increase in the manufacturing cost of the printed circuit assembly. The use of connector springs also allows multiple connection locations at specified points on the edge of the printed circuit assembly. The spring connectors can be used with existing cardcage designs, as long as conductive cardcage guides are used. Also, the use of spring connectors as a connecting device has no adverse effect on airflow around the printed circuit assembly.

BRIEF DESCRIPTION OF THE DRAWINGS

FIG. 2 shows electrical devices used to terminate a geometrically induced transmission line which is formed by the PCA and card case shown in FIG. 1, in accordance with a preferred embodiment of the present invention.

FIG. 3 shows an equivalent electrical circuit for the terminated transmission line shown in FIG. 2, in accordance with a preferred embodiment of the present invention.

FIG. 4 shows an electrical device used to terminate another geometrically induced transmission line which is formed within the PCA shown in FIG. 1, in accordance with a preferred embodiment of the present invention.

FIG. 5 shows an equivalent electrical circuit for the terminated transmission line shown in FIG. 4, in accordance with a preferred embodiment of the present invention.

DESCRIPTION OF THE PREFERRED EMBODIMENT

Figure 1:
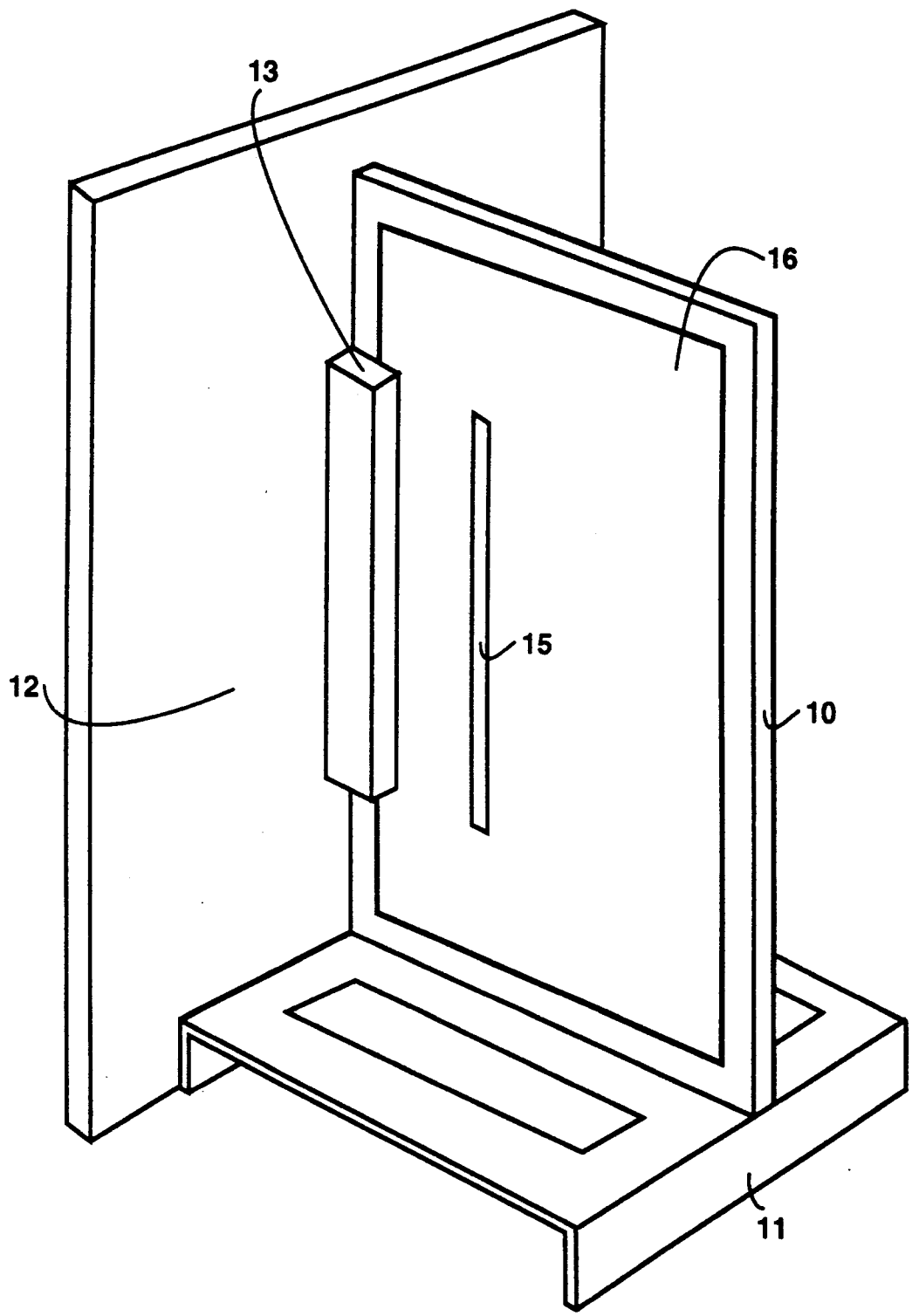
FIG. 1 shows a printed circuit assembly (PCA) inserted into a connector on the backplane of a computing system.

FIG. 1 shows a printed circuit assembly (PCA) 10 plugged into a connector 13 on a computer backplane 12. A metal plane 16 within PCA 10 is for example a ground plane or a power plane.

A slot or gap of any length between two metal surfaces can form a potential transmission line which can serve as a radiating structure which propagates and enhances RF signals generated by PCA 10. For example, a geometrically induced transmission line may be formed by metal plane 16 of PCA 10 and metal base 11. Metal base 11 is separated from metal plane 16. A slot 15, separating two portions of metal plane 16 may be used in the termination of a geometrically induced transmission line in accordance with a preferred embodiment of the present invention, as further described below.

FIG. 2 shows a solution to the formation of geometrically induced transmission lines, in accordance with the preferred embodiment of the present invention. Within PCA 10, an insulation/dielectric region 14 separates metal plane 16 from the edges of PCA. In proximity insulation/dielectric region 14, discrete components, which act as transmission line terminators are added to PCA 10. For example, a discrete component 18, a discrete component 19 and a discrete component 20 are shown. A connector 21, as will be further described below, connects discrete component 18 to metal base 11. A connector 22 connects discrete component 19 to metal base 11. A connector 23 connects discrete component 20 to metal base 11. Wire traces on PCA 10 connect discrete components 18, 19 and 20 to metal plane 16, and to connectors 21 through 23, respectively.

FIG. 3 shows an electrical equivalence of the components shown in FIG. 2. An arrow 32 along a wire 36 represents current flow along the edge of metal plane 16. An arrow 33 along a wire 31 represents current flow along the edge of metal base 11. An arrow 34 represents an electric field across the region between metal plane 16 and metal base 11. An impedance 38 represents the impedance of discrete component 18. An impedance 39 represents the impedance of discrete component 19. An impedance 40 represents the impedance of discrete component 20.

The values of the impedances are selected based on the characteristic of the transmission line which propagates RF signals between metal plane 16 of PCA 10 and metal base 11. In one useful embodiment of the present invention, impedance 38 is 75 ohms, impedance 40 is 75 ohms and impedance 39 is very large (i.e. discrete component 19 and connector 22 are removed). If the transmission line is also 75 ohms, then a high frequency field structure propagating along the transmission line will be terminated or absorbed.

In another useful embodiment of the present invention impedance 38 and impedance 40 are very small (i.e., they are electrical shorts) and impedance 39 is ten ohms. In this case the transmission line acts like an RF energy trapping slot with lossy impedance (low Q) thus dissipating energy.

FIG. 4 shows another possible method of remedying RF energy noise in PCA 10 in accordance with a preferred embodiment of the present invention. A metal plane 41 is, for example, separated from metal plane 16 by dielectric region 42. For example, metal plane 16 could be the power plane of PCA 10 and metal plane 41 could be the ground plane of PCA 10.

Looking across planes 16 and 41 at some point is like looking into a transmission structure having an instantaneous surge or characteristic impedance that is quite low if the spacing between planes 16 and 41 is small. A signal will propagate between planes 16 and 41 until the signal reaches the boundaries or some discontinuity, at which point reflections occur. Slot 15, within plane 16 can set up a transformation of energy from the internal signal propagating between planes 16 and 41 into the slot transmission system. A wave or current passing slot 15 transforms energy into slot 15 where it will exist in an impedance structure that can be terminated, for example, with a lossy resistive element 43.

FIG. 5 shows an approximate electrical equivalence of the components shown in FIG. 4. Slot 15 creates an effect that is similar to a transformer 55 connected from plane 16 to plane 41 via a capacitance 62. Transformer 55 couples RF energy in its range of acceptance into an impedance 63, which represents the impedance of lossy element 43. Various currents and potentials are represented in FIG. 5 by arrows. For example, a current 59 and a potential 53 are the incident elements of the power incident on slot 15. A current 58 and a potential 57 are the transformed components of the power incident on impedance 63. A current 60 and potential 53 serve as inputs to transformer 55. A current 61 and a potential 54 indicate that the transformation is not complete and that certain magnitudes of current and voltage pass the slot with some modification in amplitude.

In one useful embodiment of the present invention, slot 15 is 0.010 inches in width and three inches long laterally in a power plane which is 5 inches wide. Across the center of slot 15, lossy resistive element 43 is placed and has an impedance of 2 ohms. No slot is cut in metal plane 41. Using this embodiment, it is possible to realize reductions of power greater than one half of the incident at frequencies where boundary induced reflections are encountered.

Figure 6:
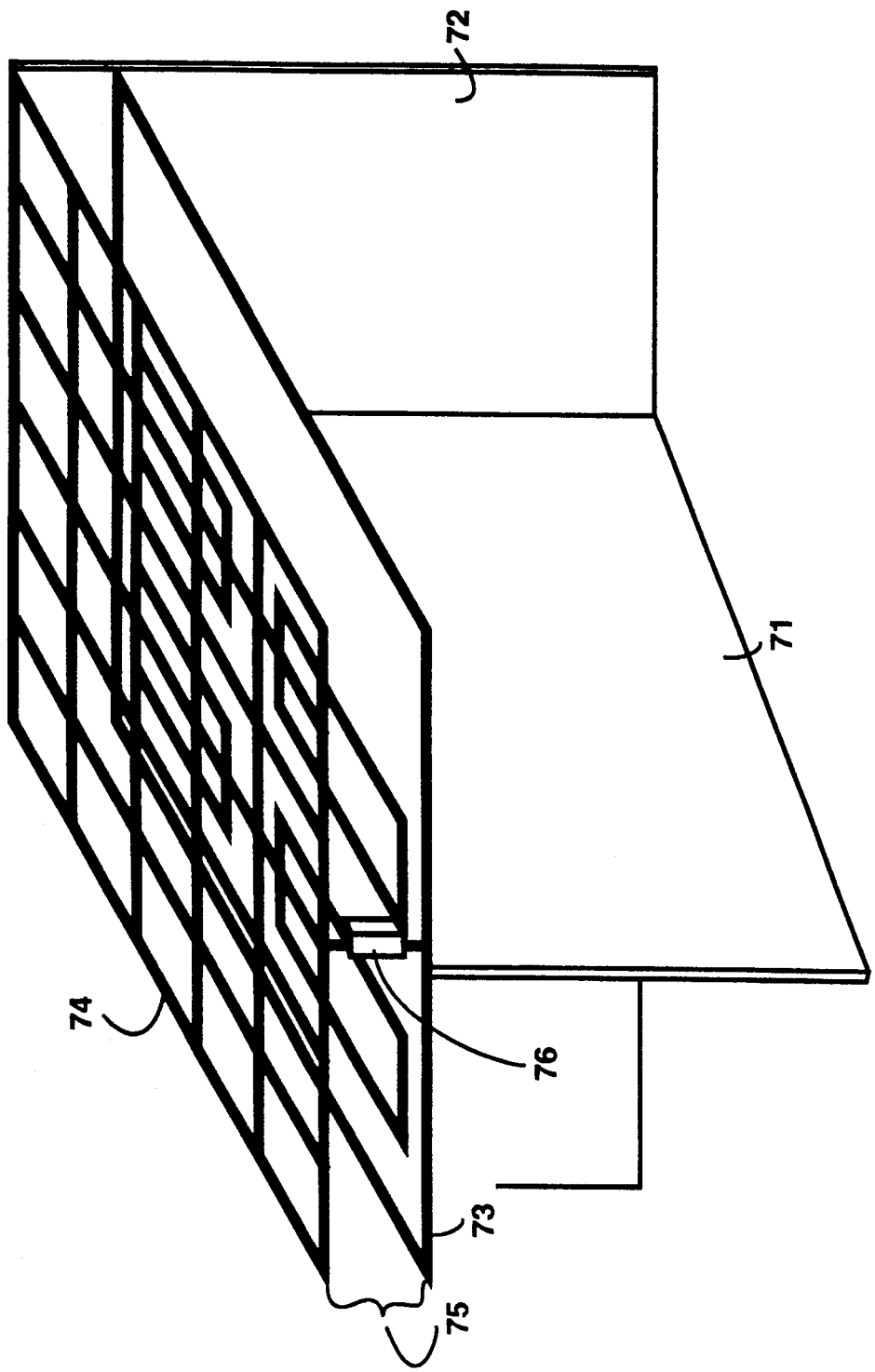
FIG. 6 shows the implementation of a grate/screen and lossy termination in accordance with a preferred embodiment of the present invention.

FIG. 6 shows a three dimensional implementation of a grate/screen and lossy termination in accordance with an alternate embodiment of the present invention. A PCA daughter board 71 is connected to a PCA mother board 72 as shown. A card guide plane 73 with air holes is placed so as to guide connection of PCA daughter board 71 to PCA mother board 72. A combination shield and airflow screen 74 is connected above card guide plane 73, separated by a gap 75. A lossy termination, represented by the placement of discrete component 76, may be used to terminate a geometrically induced transmission line. In addition to card guide plane 73 being used to guide connection of a top edge of PCA daughter board 71, an additional card guide plane with an accompanying combination shield and airflow screen (not shown) is used to guide connection of a bottom edge of PCA daughter board 71.

Figure 7:
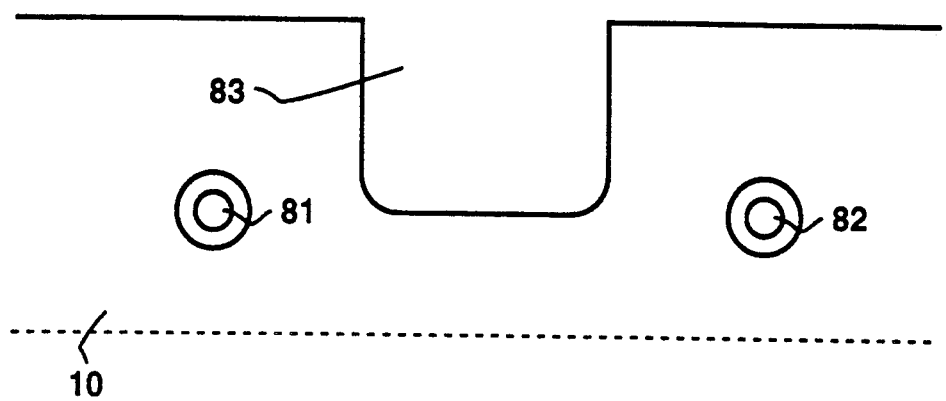
FIG. 7 shows a physical structure placed on an edge of a PCA, used to support an electrical grounding spring in accordance with a preferred embodiment of the present invention.
Figure 8:
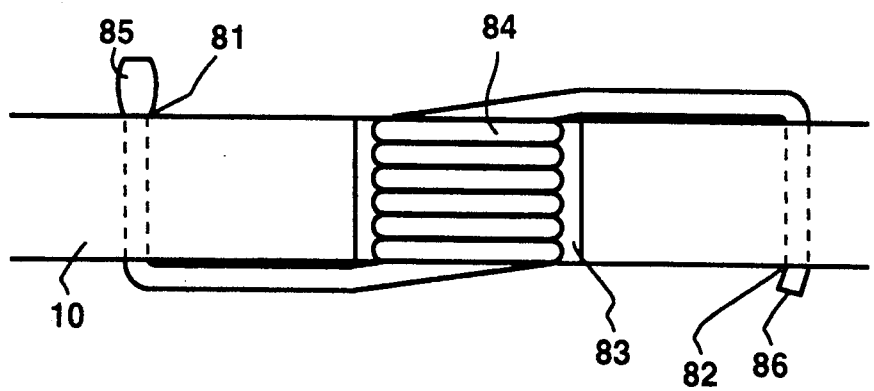
FIG. 8 shows an electrical grounding spring in accordance with a preferred embodiment of the present invention.

FIG. 7 and FIG. 8 show a preferred embodiment for constructing connectors 21, 22 and 23. In general a small grounding spring is attached to PCA 10 for each connection by having the ends of the spring plug into plated-through vias on the circuit board. A via is a plated through hole in the PCA that is connected to an internal or external plane, such as a signal plane, a power plane or a ground plane. In the present invention, the via may be connected to a trace wire, which is in turn connected to one of discrete components 18, 19 or 20. Alternately, when constructing an electrical short, the via may be connected directly to a ground plane.

As shown in FIG. 7, for each connector, a notch 83 in the edge of PCA 10 is a routered-in detail formed during a router operation upon PCA 10. Notch 83 is, for example, 0.15 inches deep and 0.20 inches across. A via 81 and a via 82 are drilled into PCA 10 and plated. As shown in FIG. 8, a connector spring 84 may then be attached to PCA 10. The ends of connector spring 84 are placed in via 81 and via 82. In order to assure reliable connection, the diameter of via 81 and via 82 should be only slightly larger than the diameter of the wire used to form connector spring 84. For example, when the wire to form connector spring 84 is 0.015 inches in diameter, a preferred width for via 81 and via 82 is 0.019 inches. The number of coils of connector spring 84 is chosen so that it accurately fits across the thickness of PCA 10. For example, if PCA 10 is 0.093 thick, connector spring 84 is 0.090 thick, requiring 6 coils of 0.015 inch diameter wire. The outer diameter of the coils of connector spring 84 is, for example, 0.135 inches.

The pivot ends of connector spring 84 should fit in the vias 81 and 82 from opposite sides of PCA 10. This makes the spring legs hug the surface of the PCA and become quite resistant to falling out or becoming snagged or damaged. If both ends are plugged into the same side of the PCA, the connector spring would have a higher chance of being bent or damaged, since the PCA could only provide protection from damage in one direction. Further, if both ends are plugged into the same side of the PCA, the spring could also develop some lateral forces.

The pivot ends of the spring preferably have a detail that will help retain the spring in the via. For example, a tab 85 of connector spring 84 may be flattened before insertion into a via. Alternately, a hooked end 86 of connector spring 84 may be utilized to assure connector spring 84 remains in place on PCA 10. Coils should be formed in the center part of the spring. These coils allow the spring to deflect in a direction that is parallel to the board centerline. No lateral deflection of the spring means no unwanted lateral forces on the board. The coiled design of connector spring 84 helps to prevent snagging on the sheet metal cardcage. When the spring is in a relaxed state and not installed on the PCA, the pivot ends should be further apart than the distance between the pivot vias. This puts the spring into a slightly torsioned mode when installed onto the PCA, which helps keep the spring from falling off the PCA, prior to the PCA being installed into a card cage. When the spring is deflected, the torsion is further increased.

Figure 9:
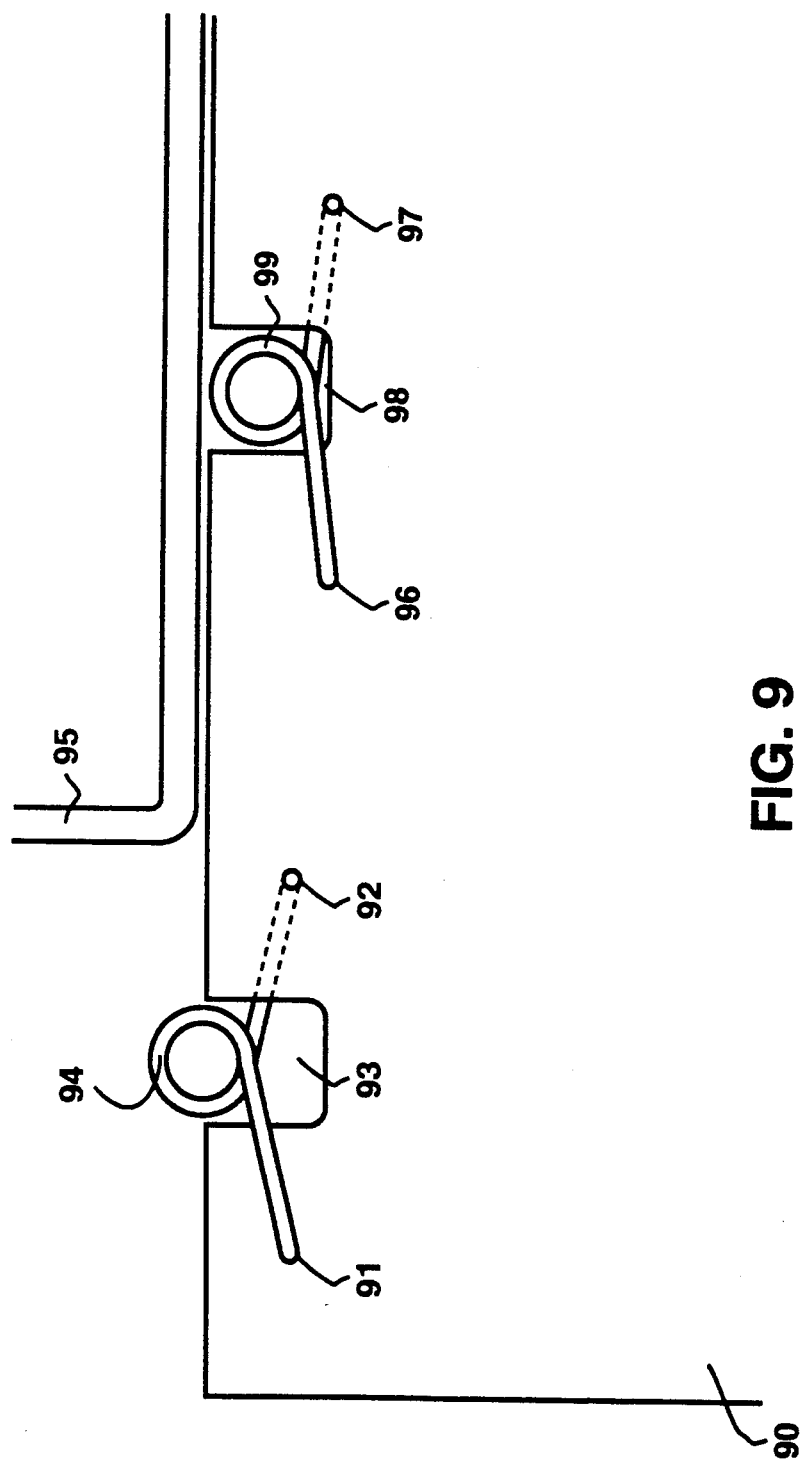
FIG. 9 shows electrical grounding springs placed on a PCA in accordance with a preferred embodiment of the present invention.

FIG. 9 shows operation of connectors in accordance with a preferred embodiment of the present invention. A connector spring 94 is shown connected to PCA 90 through a via 91 and a via 92. Connector spring 94 is in an undeflected state. Upon being deflected, connector spring 94 will retreat into groove 93 of PCA 90.

A connector spring 99 is shown connected to PCA 90 through a via 96 and a via 97. Connector spring 99 is in a deflected state. Upon being deflected, connector spring 99 retreated into groove 98 of PCA 90. Connector spring 99 makes electrical contact with metal card cage 95, which causes the deflection of connector spring 99. Connector spring 99, through metal plating within via 96 and 97, is electrically connected to a ground plane or is electrically connected to a lossy component through a trace wire, in accordance with various embodiments of the present invention described above.

Figure 10:
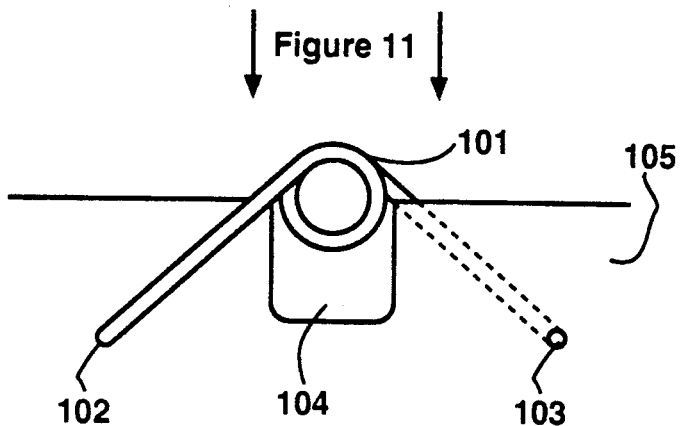
FIG. 10 and FIG. 11 show an alternate embodiment of an electrical grounding spring in accordance with the present invention.
Figure 11:
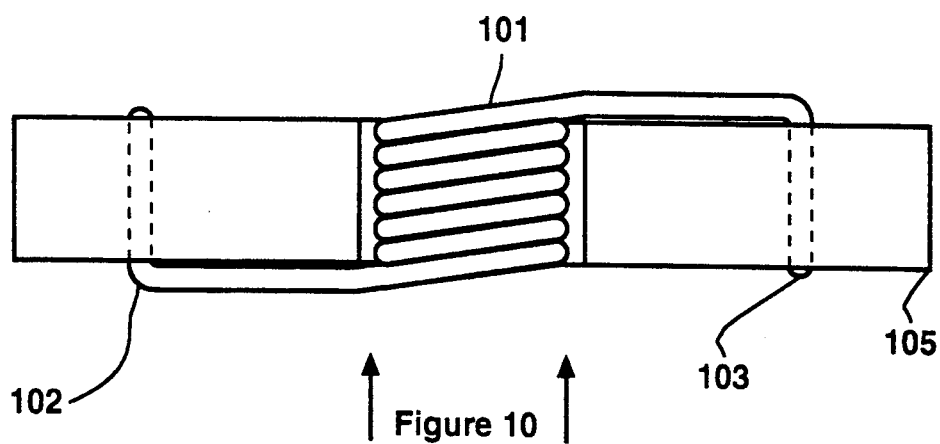

FIGS. 10 and 11 show an alternate embodiment of a connector spring in accordance with the present invention. In FIG. 10 and FIG. 11, there is shown various views of a connector spring 101 connected to a PCA 105 by a via 102 and via 103. A cavity 104 receives connector spring 101 when connector spring 101 is deflected by a metal surface.

Figure 12:
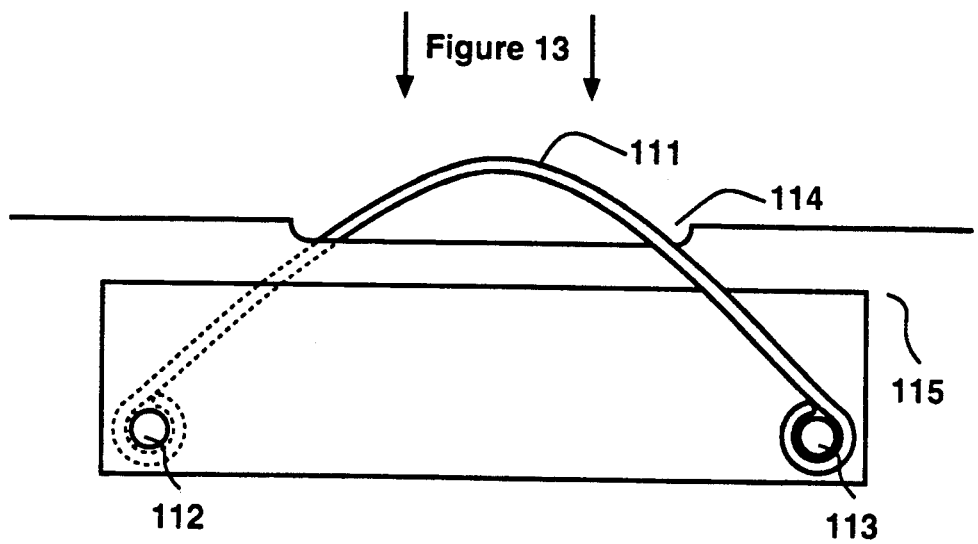
FIG. 12 and FIG. 13 show another alternate embodiment of an electrical grounding spring in accordance with the present invention.
Figure 13:
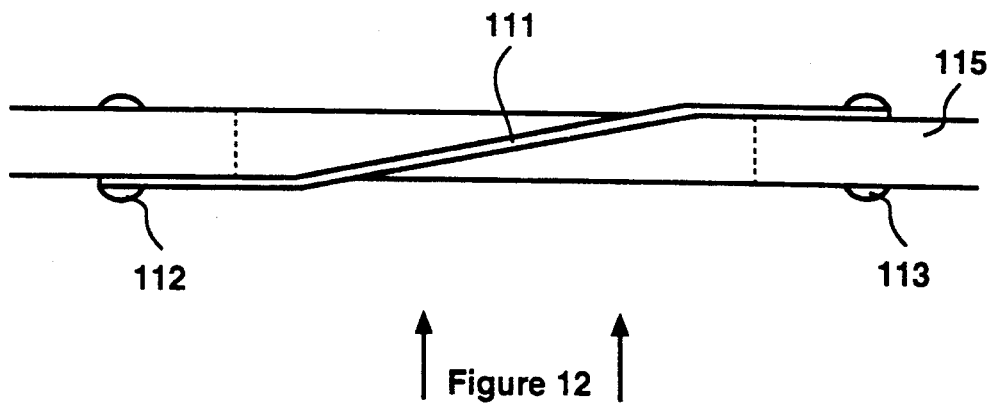

FIGS. 12 and 13 show another alternate embodiment of connector springs in accordance with the present invention. In FIG. 12 and FIG. 13, there is shown various views of an uncoiled connector spring 111 connected to a PCA 115 by a rivet 112 and rivet 113. An indentation 114 receives connector spring 111 when connector spring 111 is deflected by a metal surface. Rivet 111 and rivet 112 are placed through plate vias. Screws or drive pins may be used in place of rivets. Additionally, the spring connectors shown in FIGS. 7 through 13 may be used in other applications, such as for electrostatic discharge protection.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A device for reducing radio frequency emissions within a computer system having a printed circuit assembly in proximity of a metal surface, the device comprising:
   a lossy component electrically coupled to a metal plane within the printed circuit assembly; and,
   a connector electrically coupled to the lossy component and to the metal surface.

2. A device as in claim 1 wherein the lossy component is a resistor.

3. A device as in claim 1 wherein the lossy component comprises two resistors at opposite ends of an edge of the printed circuit assembly that is closest to the metal surface.

4. A device as in claim 1
   wherein the lossy component is a resistor in the middle of an edge of the printed circuit assembly that is closest to the metal surface; and,
   wherein the device additionally comprises
   a second connector at a first end of the edge of the printed circuit assembly that is closest to the metal surface, and
   a third connector at a second end of the edge of the printed circuit assembly that is closest to the metal surface, the second connector and the third connector being directly coupled to the metal plane within the printed circuit assembly.

5. A device as in claim 1 wherein the connector is a spring, ends of the spring being inserted into vias within the printed circuit assembly, wherein traces on the printed circuit assembly electrically couple the vias to the lossy component.

6. A method for reducing radio frequency emissions within a computer system having a printed circuit assembly in proximity of a metal surface, the method comprising the steps of:
   (a) electrically connecting a lossy component to a metal plane within the printed circuit assembly; and,
   (b) electrically connecting the lossy component to the metal surface.

7. A method as in claim 6 wherein step (a) comprises connecting a resistor to the metal plane within the printed circuit assembly.

8. A method as in claim 6 wherein step (a) comprises connecting two resistors at opposite ends of an edge of the printed circuit assembly that is closest to the metal surface.

9. A method as in claim 6 wherein step (a) comprises connecting a resistor to the metal plane within the printed circuit assembly, the resistor being located in the middle of an edge of the printed circuit assembly that is closest to the metal surface.

10. A method as in claim 9 additionally comprising the steps of:
    (c) connecting a second connector at a first end of the edge of the printed circuit assembly that is closest to the metal surface, the second connector being in electrical contact with the metal surface, including connecting the second connector to the metal plane within the printed circuit assembly; and
    (d) connecting a third connector at a second end of the edge of the printed circuit assembly that is closest to the metal surface, the third connector being in electrical contact with the metal surface, including connecting the third connector to the metal plane within the printed circuit assembly.

11. A method as in claim 6 wherein step (a) includes placing a spring in electrical contact with the metal surface, ends of the spring being inserted into vias within the printed circuit assembly, including connecting traces on the printed circuit assembly between the vias and the lossy component.

12. A device for electrically connecting a printed circuit assembly with a metal surface, the connector comprising:
    a spring, the spring having a first end and a second end, the first end being inserted in a first via within the printed circuit board, and the second end being inserted in a second via within the printed circuit board, wherein when the spring is deflected by the metal surface, the spring establishes electrical contact with the metal surface and a portion of the spring retreats into a cavity within the printed circuit assembly.

13. A device as in claim 12 wherein the first end enters the first via on a first side of the printed circuit assembly and the second end enters the second via on a second side of the printed circuit assembly.

14. A device as in claim 12 wherein the spring includes a coil, and when the spring is deflected by the metal surface, the coil of the spring retreats into the cavity within the printed circuit assembly.

15. A device as in claim 12 wherein the first via and the second via is electrically connected to a plane within the printed circuit assembly.

16. A device as in claim 12 wherein the first via and the second via are electrically connected through a lossy component to a plane within the printed circuit assembly.

* * * * *